(12) United States Patent
Thompson et al.

(10) Patent No.: US 9,472,456 B2
(45) Date of Patent: Oct. 18, 2016

(54) TECHNOLOGY FOR SELECTIVELY ETCHING TITANIUM AND TITANIUM NITRIDE IN THE PRESENCE OF OTHER MATERIALS

(71) Applicant: Intel Corporation, Santa Clara, CA (US)

(72) Inventors: Erica J. Thompson, Beaverton, OR (US); Nabil G. Mistkawi, Keizer, OR (US); Rohit Grover, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 24 days.

(21) Appl. No.: 14/140,085

(22) Filed: Dec. 24, 2013

(65) Prior Publication Data
US 2015/0179510 A1 Jun. 25, 2015

(51) Int. Cl.
*H01L 21/302* (2006.01)
*H01L 21/461* (2006.01)
*H01L 21/768* (2006.01)
*H01L 21/321* (2006.01)
*H01L 21/3213* (2006.01)

(52) U.S. Cl.
CPC ... *H01L 21/76897* (2013.01); *H01L 21/32115* (2013.01); *H01L 21/32134* (2013.01); *H01L 21/7684* (2013.01); *H01L 21/76865* (2013.01)

(58) Field of Classification Search
None
See application file for complete search history.

(56) References Cited

U.S. PATENT DOCUMENTS

| 5,828,591 | A | 10/1998 | Rotstain | |
|---|---|---|---|---|
| 6,191,463 | B1* | 2/2001 | Mitani et al. | 257/411 |
| 6,492,271 | B1* | 12/2002 | Uozumi | H01L 21/32134 |
| | | | | 257/E21.309 |
| 8,025,811 | B2 | 9/2011 | Mistkawi et al. | |
| 2005/0145894 | A1* | 7/2005 | Chau et al. | 257/288 |
| 2006/0091454 | A1* | 5/2006 | Uchiyama | 257/330 |
| 2007/0235684 | A1* | 10/2007 | Mistkawi et al. | 252/79.1 |
| 2011/0147829 | A1* | 6/2011 | Nakajima | H01L 29/0634 |
| | | | | 257/329 |

FOREIGN PATENT DOCUMENTS

WO 2013048449 A1 4/2013

* cited by examiner

*Primary Examiner* — Mohammad Islam
*Assistant Examiner* — Jay C Chang
(74) *Attorney, Agent, or Firm* — Grossman, Tucker, Perreault & Pfleger, PLLC (57) ABSTRACT

Methods for selectively etching titanium and titanium nitride are disclosed. In some embodiments the method involve exposing a workpiece to a first solution to remove titanium nitride, exposing the workpiece to a second solution to remove titanium, and exposing the workpiece to a third solution to remove residual titanium nitride, if any. The solutions are formulated such that they may selectively remove titanium and/or titanium nitride, while not etching or not substantially etching certain other materials such as dielectric materials, oxides, and metals other than titanium.

24 Claims, 9 Drawing Sheets

Etch Rate of Various Materials Upon
Exposure to Second Solution

| Thin Film Material | Etch Rate at 60°C (Ang/Min) |
|---|---|
| Ti | 120 |
| W | 0 |
| CVD SiO$_x$ | 0 |
| CDO | 0 |
| Cu | 0 |
| Si$_3$N$_4$ | 0 |
| SiC | 0 |

TECHNOLOGY FOR SELECTIVELY ETCHING TITANIUM AND TITANIUM NITRIDE IN THE PRESENCE OF OTHER MATERIALS

FIELD

The present disclosure relates to technologies for selectively etching titanium and titanium nitride on a workpiece in the presence of other materials. In particular, the present disclosure relates to methods for selectively removing titanium and titanium nitride in the present of at least one of metals, oxides, and dielectric materials.

BACKGROUND

The production of semiconductor devices often involves forming microelectronic devices on a microelectronic substrate, such as a silicon wafer. These microelectronic devices may include for example transistors, resistors, capacitors, combinations thereof, and the like, which may be connected to one another and other components via a metallization pattern (metal interconnects), so as to form one or more integrated circuits.

Various processes are known for forming integrated circuits on a microelectronic substrate. Among those processes is the so-called "damascene process," which typically involves using a photoresist and etching processes to selectively remove material from the microelectronic substrate or other dielectric material. For example, the photoresist material may be patterned on a dielectric material, after which the dielectric material may be etched to form a holes or "trench" (hereinafter, opening) consistent with the photoresist pattern. After etching the photoresist may be removed (e.g., using an oxygen plasma or selective wet etching) and the opening is then filled with a conductive material such as a metal or metal alloy, e.g., via physical vapor deposition, chemical vapor deposition, electroplating, or some other mechanism as will be understood to those skilled in the art.

Over time the size of microelectronic devices has shrunk dramatically, while their complexity has increased. As a result, it is becoming increasingly difficult to form suitable openings (e.g., vias, traces, etc.) using conventional masking materials and metal nitrides such titanium and titanium nitride are being increasingly used by integrated circuit manufacturers as hard masking materials, as well as a barrier layer or conductive layer that may be useful in a microelectronic device or the production thereof. For example, a bilayer of titanium and titanium nitride may be used as a fill barrier during the production of gates and/or gate contacts in microelectronic transistors, such as non-planar transistors.

With the foregoing in mind, layers of Ti and TiN are often deposited in such a manner that they are present on the surfaces they are intended to cover, but also adjacent surfaces as well. Because titanium is conductive, the presence of it on such adjacent surfaces may cause problems, particularly if the layers create an electric pathway between multiple microelectronic devices or components thereof. Indeed, the titanium may cause an electrical short in such instances, which may prevent its associated microelectronic device from functioning properly.

To address this issue, technologies such as polishing, high density plasma etching and hydrofluoric (HF) acid based wet etching chemistries have been developed in an attempt to selectively remove titanium and titanium nitride from workpieces such as microelectronic devices. While such technologies are effective, their use often results in damage to the surface of the workpiece, and/or structures that are in proximity to the target titanium and titanium nitride. For example, titanium and titanium nitride are often used in proximity to metals, oxides, insulating materials, dielectric materials, etc., any or all of which may attacked by a high density plasma or conventional HF acid based wet etching chemistry. Therefore high density plasma or conventional HF acid wet etching chemistries may not be ideal in circumstances where it is desired to etch titanium and/or titanium nitride in the presence of metals, oxides, and/or dielectric materials.

BRIEF DESCRIPTION OF THE DRAWINGS

Features and advantages of embodiments of the claimed subject matter will become apparent as the following Detailed Description proceeds, and upon reference to the Drawings, wherein like numerals depict like parts, and in which:

Although the following Detailed Description will proceed with reference being made to illustrative embodiments, many alternatives, modifications, and variations thereof will be apparent to those skilled in the art.

DETAILED DESCRIPTION

As noted in the background, titanium and titanium nitride are commonly used as hard masks and barrier layers in the production of microelectronic devices. Because they are difficult to etch, prior known technologies may resort to the use of aggressive polishing, plasma and/or hydrofluoric acid etching to remove titanium and titanium nitride. During polishing processes, the surface of the microelectronics device may become damaged or uneven. Similarly, plasma or HF etching chemistry may contact and attack oxides, metals, insulating materials, and/or dielectric materials as they are used to remove titanium and titanium nitride. Prior known technologies for removing Ti and TiN may therefore be undesirable in circumstances where such materials are to be etched in the presence of oxides, metals, insulating materials, and/or dielectric materials.

With the foregoing in mind, one aspect of the present disclosure relates to methods for selectively removing titanium (Ti), titanium nitride (TiN) and optionally titanium silicide ($TiSi_x$) from a workpiece. As will be described in detail, the methods of the present disclosure may enable the selective removal of Ti, TiN and optionally $TiSi_x$ in the presence of at least one of a metal other than titanium, dielectric materials, oxides and combinations thereof. Unlike prior known processes, the disclosed methods utilize chemistries that are highly selective to Ti, TiN and optionally $TiSi_x$, but which do not substantially attack other metals, oxides, and/or dielectric materials. As a result, sensitive materials that are in the presence of the Ti, TiN, and optionally $TiSi_x$ to be removed may be substantially unaffected by the methods described herein.

As used herein, the phrase "in the presence of" is used in connection with various materials to indicate that the material will or is likely to be exposed to one or more etching chemistries during the removal of Ti, TiN and/or $TiSi_x$. Therefore the phrase, "etching titanium and titanium nitride in the presence of " a specified material should be understood to mean that the specified material will or is likely to be exposed to the etching chemistry used to remove titanium and titanium nitride.

As used herein, the phrase "does not etch or does not substantially etch" and similar phrases mean that an etching chemistry either does not etch a material, or etches a material at a substantially slower (e.g., 10-100 times slower) rate than the chemistry etches another material, such as titanium or titanium nitride.

Figure 1:
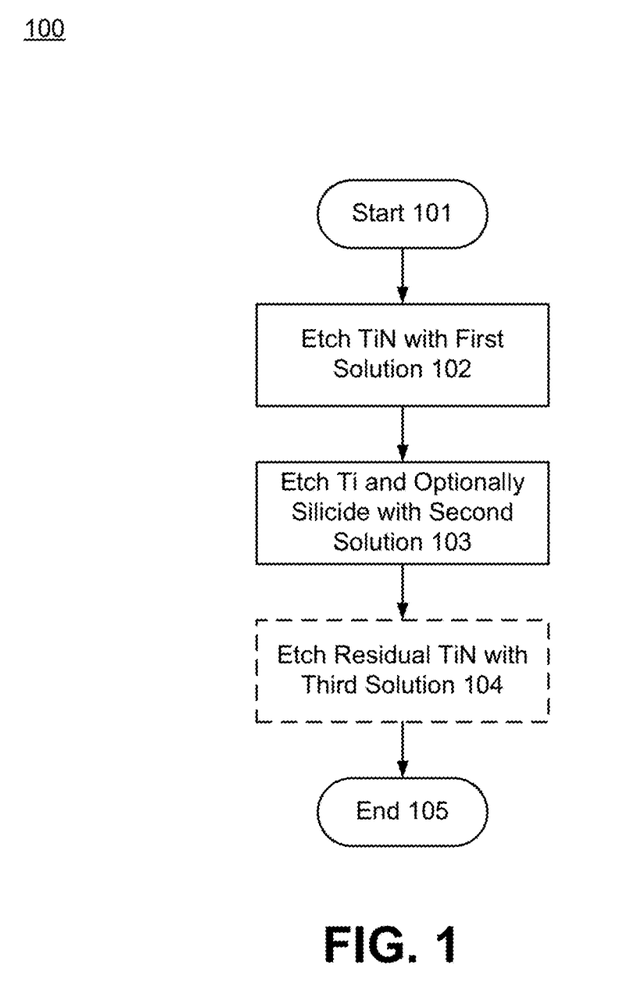
FIG. 1 is a flow diagram depicting exemplary operations of one method of selectively etching titanium, titanium nitride and optionally titanium silicide consistent with the present disclosure.

Reference is now made to FIG. 1, which depicts exemplary operations of one example method of selectively removing Ti, TiN and optionally $TiSi_x$ from a workpiece consistent with the present disclosure. As shown, method 100 begins at block 101. The method may then proceed to block 102, wherein TiN on the workpiece is etched with a first solution consistent with the present disclosure. The method may then proceed to block 103, wherein Ti and optionally $TiSi_x$ on the workpiece are etched with a second solution consistent with the present disclosure. The method may then proceed to optional block 104, wherein residual TiN, if any, is etched from the workpiece with a third solution consistent with the present disclosure. The method may then proceed to block 105 and end.

As used herein, the term "workpiece" refers to any of a wide variety of substrates, electronic components, microelectronic components, combinations thereof, and the like, which may include one or more regions in which titanium and titanium nitride are used. In some embodiments, the workpieces described herein include at least a first portion that includes Ti and TiN, e.g., in the form of one or more thin film layers. In further embodiments the workpieces described herein may further include at least one of an oxide and an insulating material that are proximity to the Ti and TiN, titanium and titanium nitride, such that they will be in the presence of the Ti and TiN as they are etched. Without limitation, the workpieces of the present disclosure are preferably a microelectronic component/device or a precursor thereof, which includes Ti and TiN as a hard mask layer, conductive layer, diffusion barrier layer, a combination thereof, or the like. One example precursor of a microelectronic component/device is a precursor of a non-planar transistor, in which layers of Ti and TiN may be used as a gate contact barrier between a gate contact filling material and a gate contact, as will be described later in connection with FIGS. 4A-4G.

In some embodiments, the workpieces described herein include a first portion including a substrate upon which a Ti layer is disposed. To prevent or hinder oxidation of the Ti or for some other purpose, a layer of TiN may be disposed on the surface of the Ti layer. The first or other portions of the workpiece may in some embodiments include oxides, dielectric materials, and/or metals other than Ti, and/or structures including such materials. Such materials and/or their respective structures may be in the presence of the Ti and TiN layer as such layers are etched. As will be described below, such materials and structures formed therefrom may be unaffected or substantially unaffected by the etching processes described herein.

Non-limiting examples of oxides and/or dielectric materials that may not be etched or may not be substantially etched by the solutions described herein include silicon oxides (e.g., $SiO_x$ such as $SiO_2$), carbon doped oxide (CDO), hafnium oxide, hafnium silicon oxide, lanthanum oxide, lanthanum aluminum oxide, zirconium oxide, zirconium silicon oxide, tantalum oxide, yttrium oxide, aluminum oxide, lead scandium tantalum oxide, lead zinc niobate, and combinations thereof.

Non-limiting examples of metals other than titanium which may not be etched or may not be substantially etched by the solutions described herein include polysilicon, tungsten, ruthenium, palladium, platinum, cobalt, nickel, hafnium, zirconium, tantalum, aluminum, metal carbides (e.g. tungsten carbide, silicon carbide, aluminum carbide, etc.), metal nitrides other than TiN (e.g., $Si_3N_4$), and conductive metal oxides.

For the sake of illustration the present disclosure will proceed to further describe the process of FIG. 1 as it is used to selectively remove Ti and TiN from a substrate, wherein such materials are present as a bilayer. That is, the workpiece for the sake of this example description includes a substrate having a Ti layer formed thereon, and a TiN layer disposed on the Ti layer.

Returning to FIG. 1 and in the context of a workpiece including a layer of Ti passivated by a layer of TiN as described above, the process at block 102 involves selectively etching the TiN layer by contacting it with a first solution consistent with the present disclosure. In general, the first solution is an etching chemistry that is capable of etching titanium nitride at a first rate, while not etching or not substantially etching oxides, dielectric materials, metals other than titanium, etc. which may be in the presence of the TiN layer.

In some embodiments, etching of TiN is accomplished by exposing the TiN to a first solution that includes a mixture of strong acid and peroxide. Non-limiting examples of suitable strong acids include sulphuric acid, nitric acid, hydrochloric acid, perchloric acid, combinations thereof, and the like. Without limitation, the strong acid in the first solutions of the present disclosure is preferably sulphuric acid.

Non-limiting examples of suitable peroxides that may be used in the first solutions of the present disclosure include inorganic peroxides such as hydrogen peroxide, metal peroxides (e.g. peroxides of group I or group II metals), organic peroxides, and peroxyacids such as peroxymonosulphuric acid and peroxydisulphuric acid. Without limitation, the peroxide used in the first solutions of the present disclosure is preferably hydrogen peroxide.

Therefore in some embodiments of the present disclosure, the first solutions described herein include a combination of sulphuric acid and hydrogen peroxide. In such solutions, the weight ratio of sulphuric acid to peroxide may vary from about 1:15 to 15:1, such as from about 1:12 to 12:1, from about 10 to 1 to 1:10, from about 10:7 to 7:1, from about 1:4 to 4:1, or even from about 2:3 to 3:2. Without limitation, the weight ratio of sulphuric acid to hydrogen peroxide is preferably about 12:1 or even about 7:1.

Put in other terms, in some embodiment the first solutions of the present disclosure may contain from about 69 to about 97% by weight sulphuric acid, and about 3 to about 30 weight percent hydrogen peroxide, such as about 75 to about 93 weight % sulphuric acid and about 7 to about 15 weight percent hydrogen peroxide. Without limitation, the first solutions of the present disclosure preferably contain sulphuric acid in an amount of about 69 to 92 weight percent (e.g., about 92.1 weight %), and peroxide in an amount of about 31 to 8 weight percent (e.g., about 7.9 weight %). In further non-limiting embodiments, the first solution contains about 69 to about 82 weight percent sulphuric acid (e.g., about 76 weight %), about 7 to about 12 weight % hydrogen peroxide (e.g., about 11 weight %), and the balance water.

The temperature of the first solution may have an impact on TiN etch rate and/or other properties. Therefore it may be desirable to control the temperature of the first solution as it is used to remove TiN from a workpiece. In some embodiments the temperature of the first solution ranges from about 60 to about 140° Celsius, such as from about 80 to about 120° Celsius or even about 90 to 110° Celsius, when it is contacted with TiN on a workpiece. Without limitation, the temperature of the first solution is preferably about 100° Celsius when it is contacted with TiN on a workpiece.

As noted previously, the first solutions of the present disclosure are capable of etching titanium nitride at a desirable rate. In this regard, reference is made to FIG. 2, which plots the TiN etch rate (in angstroms per second) during numerous examples in which a layer of TiN was etched with a first solution containing 92.1 weight % sulphuric acid and 7.9 weight percent hydrogen peroxide at 100° Celsius. As shown, the observed TiN etch ranged from about 2.1 to about 2.6 angstroms per second, with the majority of observed etch rates between 2.2 and 2.4 angstroms per second. The average observed etch rate was between about 2.3 and about 2.4 angstroms per second.

Figure 2:
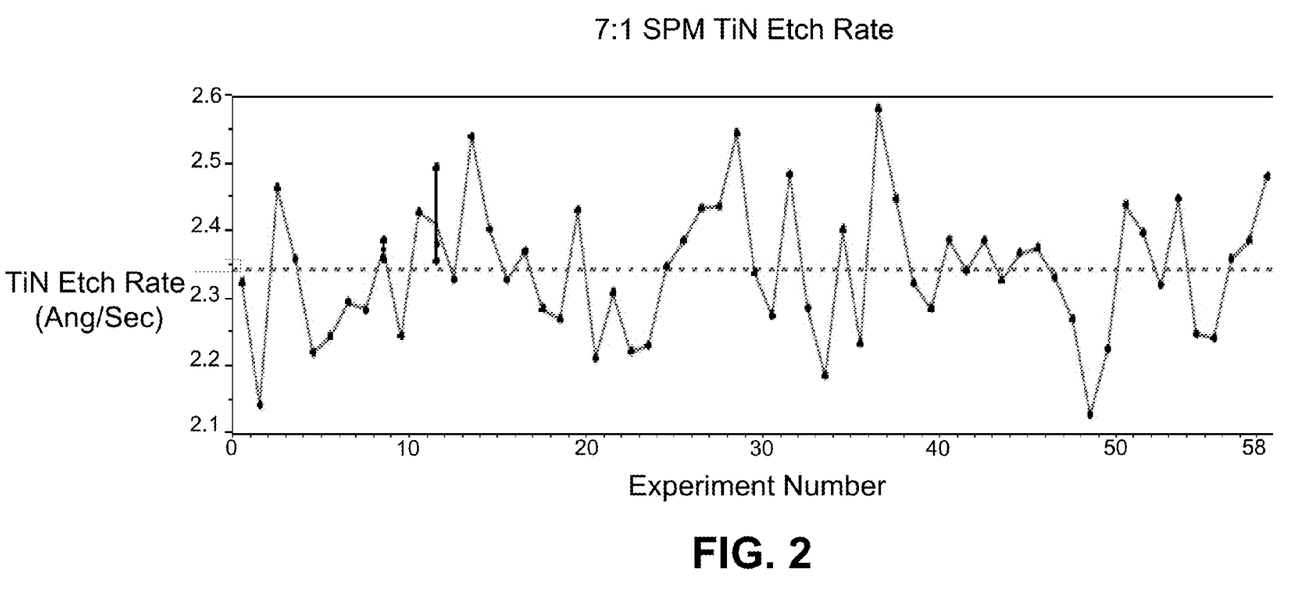
FIG. 2 is a graph plotting titanium nitride etch rate observed during various etching experiments carried out using one example of a sulphuric peroxide solution consistent with the present disclosure.

Of course, the etch rates shown in FIG. 2 are exemplary and reflect data obtained from a roughly 11.5:1 mixtures of sulfuric acid to hydrogen peroxide. TiN etch rate may vary (perhaps considerably) with the composition of the first solution. For example, as peroxide and/or sulphuric acid concentration in the first solution increases, the rate at which the first solution etches TiN also increases. While increased TiN etch rate may be beneficial in some circumstances, increasing the concentration of peroxide and sulphuric acid also increases the heat of mixing, potentially raising safety concerns. Furthermore, if the ratio of sulphuric acid to peroxide strays significantly higher or lower than the ratios noted above, the first solution may consume certain materials (e.g., metals such as tungsten) at an undesirable rate.

Accordingly and without limitation, first compositions containing roughly 12:1 to 6:1 sulphuric acid to hydrogen peroxide (such as about 8:1 to about 6:1) are particularly preferred, as they do not or do not substantially etch various materials that may be in the presence of the TiN being etched, e.g., oxides, insulators, metals other than Ti (e.g. W), etc. In this regard, it is noted that first when first compositions containing a 1:4 and 2:3 ratio of sulphuric acid to hydrogen peroxide were applied to a layer of tungsten on a workpiece, such solutions exhibited observed tungsten etch rates of 12 to about 20 angstroms per second and about 25 to about 40 angstroms per second, respectively. In contrast, a first solution containing a roughly 7:1 ratio of sulphuric acid to hydrogen peroxide was exhibited an observed tungsten etch rate of 0 angstroms per minute when applied to a tungsten layer in the same manner. This demonstrates that the first solutions of the present disclosure may be used to selective etch TiN without or without substantially etching tungsten that may be in the presence of that TiN.

Moving on, the first solution may be applied pursuant to block 102 of FIG. 1 for a sufficient time to remove all or a portion of the TiN layer from the workpiece. At that point the workpiece may be optionally processed (e.g., washed, heated, etc.) to remove the first solution. The method may proceed to block 103, wherein a second solution consistent with the present disclosure may be applied to etch the Ti layer and optionally titanium silicide ($TiSi_x$) present on the workpiece.

In general, the second solutions described herein include an etching chemistry that exhibits high selectivity towards titanium and titanium silicide, but which does not or does not substantially etch certain other materials such as oxides, dielectric materials, metals other than titanium, etc., combinations thereof, and the like, which may be in the presence of Ti, e.g., during the production of a microelectronics device. Among other things, the second solutions in accordance with the present disclosure include a corrosion inhibitor and the products of a mixture of dilute hydrofluoric acid, a silicon containing precursor, and water.

More specifically, the second compositions described herein are capable of selectively etching Ti and optionally titanium silicide (e.g., in a hard mask layer, a barrier layer, etc.), while suppressing the etching of metals (e.g., interconnect materials), oxides, and/or dielectric materials. In particular, the second solutions can selectively etch titanium and titanium silicide while suppressing the etching of metals such as tungsten and copper, which may be used as a conductive interconnect material, a gate, or a gate contact, Copper (Cu). Moreover, the second solutions may selective etch titanium and titanium silicide, while suppressing the etching of dielectric materials such as glass silicate, oxide, silicon oxide ($SiO_x$, or $SiO_2$), and carbon doped oxide (CDO). The second compositions of the present disclosure may therefore etch titanium and/or titanium silicide at a rate that is significantly faster (e.g. by about 10 to about 100 time) than the rate at which it etches W, Cu, and dielectric materials such as those noted above. In one embodiment, the second solution comprises an etching chemistry that that selectively etches a titanium layer while suppressing the etching of W and dielectric materials that are in the presence of that titanium layer.

As noted previously, the second solutions include reaction products of a mixture of dilute hydrofluoric acid (HF) and a silicon precursor. In some embodiments, the dilute HF in the mixture included in the second solution is present at a concentration ranging from about 0.1 weight percent to about 49 weight %, such as about 0.1 to about 10 weight %. The mixtures in such embodiments may further include the one or more silicon containing precursors at a concentration ranging from about 0.0001 to about 60 weight %, such as about 0.5 to about 10 weight %.

In general, the silicon containing precursors in the dilute HF can significantly suppresses the etch rate of a dielectric material such as $SiO_x$ or $SiO_2$. Moreover, because the dilute HF gives the second solution a low pH (e.g., ranging from about 1 to about 3), dissolution of metals such as tungsten may be significantly inhibited, without adversely impacting the etch rate of titanium. Accordingly, the second solutions described herein may be applied as a wet etch solution for etching a titanium layer, e.g., during the production of a microelectronics device, wherein the titanium layer is in proximity to one or more dielectric materials and/or metal contacts such as tungsten contacts.

Non-limiting examples of silicon containing precursors that can be used for the second solutions of the present disclosure include amino functional silanes, epoxy functional silanes, vinyl functional silanes, alkoxy silanes, ketoxime silanes, acetoxy silanes, diethylsilane, and diphenylsilane.

Exemplary amino functional silanes that may be used in the second solutions include but are not limited to can be aminopropyltriethoxysilane, aminopropyltrimethoxysilane, aminopropylmethyldiethoxysilane, aminopropylmethyldimethoxysilane, aminoethylaminopropyltrimethoxysilane, aminoethylaminopropyltriethoxysilane, aminoethylaminopropylmethyldimethoxysilane, diethylenetriaminopropyltrimethoxysilane, diethylenetriaminopropyltriethoxysilane, diethylenetriaminopropylmethyldimethoxysilane, diethylenetriaminopropylmethyldimethoxysilane, diethylenetriaminopropylmethyldiethoxysilane, cyclohexylaminopropyltrimethoxysilane, hexanediaminomethyltriethoxysilane, phenylaminomethyltrimethoxysilane, phenylaminomethyltriethoxysilane, diethylaminomethyltriethoxysilane, (diethylaminomethyl)methyldiethoxysilane, methylaminopropyltrimethoxysilane, combinations thereof, and the like.

Exemplary epoxy functional silanes that can be used in the second solutions of the present disclosure include but are not limited to glycidoxypropyltrimethoxysilane, glycidoxypropyltriethoxysilane, glycidoxypropylmethyldiethoxysilane, glycidoxypropylmethyldimthoxysilane, combinations thereof and the like.

Exemplary vinyl functional silanes that can be used in the second solutions of the present disclosure include but are not limited to vinyltrimethoxysilane, vinyltriethoxysilane, vinyltris(2-methoxyethoxy)silane, combinations thereof and the like.

Exemplary alkoxy silanes that may be used in the second solutions of the present disclosure include but are not limited to methyltrimethoxysilane, methyltriethoxysilane (MTES), tetramethoxysilane (TMOS), tetraethoxysilane (TEOS), tetrapropoxysilane, combinations thereof, and the like.

Exemplary ketoxime silanes that can be used in the second solutions of the present disclosure include but are not limited to methyltris(methylethylketoxime)silane (MOS), methyltris(acetoxime)silane, methyltris(methylisobutylketoxime)silane, dimethyldi(methylketoxime)silane, trimethyl(methylethylketoxime)silane, minyltris(methylethylketoxime)silane (VOS), methylvinyldi(methylethylketoxime)silane, methylvinyldi(cyclohexanoneoxime)silane, vinyltris(methyllisobutylketoxime)silane, phenyltris(methylethylketoxime)silane (POS), combinations thereof, and the like.

Exemplary acetoxy silanes that can be used in the present disclosure include but are not limited to methyltriacetoxysilane, tetraacetoxysilane, combinations thereof, and the like.

Without limitation, in some embodiments the second solutions include methyltrimethoxysilane, methyltriethoxysilane (MTES), tetramethoxysilane (TMOS), tetraethoxysilane (TEOS), tetrapropoxysilane, and combinations thereof as the silicon containing precursor. In some embodiments, the silicon containing precursor is or includes MTES.

As further noted above the second solutions of the present disclosure include a corrosion inhibitor. In general, the corrosion inhibitor may function to suppress etching of metals such as tungsten, copper, aluminum, etc., which may be used in the production of microelectronics or other devices. Non-limiting examples of suitable corrosion inhibitors that may be used in the second solutions include but are not limited to 2-mercaptobenzothiazole, 2-mercaptobenzimidazole, 5-chlorobenzotriazole, 5-methylbenzotriazole, benzotriazole, carboxybenzotriazole, tolyltriazole, 1-Phenyl-1H-tetrazole-5-thiol, hexadecyltrimethylammonium bromide, and combinations thereof.

The corrosion inhibitor may be present in the second solution in any suitable amount. In some embodiments, the corrosion inhibitor is present in the second solution at a concentration ranging from about 0.0001 to 20 weight percent, such as about 0.001 to 2 weight percent, about 0.01 to about 1 weight percent, or even about 0.01 to 0.1 weight percent. In some embodiments, the corrosion inhibitor is present in the second solution at a concentration of about 0.08 weight percent.

In addition to the foregoing components, the second solutions in some embodiments may further include one or more surfactants/emulsifying agents. In general, such agents may facilitate mixing of the dilute hydrofluoric acid with the silicon containing precursor, e.g., MTES, such that a homogenous solution may be formed. When used, the surfactants/emulsifying agents may be present in the second solution at a concentration ranging from about 0.0001 to about 50 weight %, such as about 1 to about 25 weight %.

In some embodiments the second solutions may also contain a carboxylic acid. In general, the carboxylic acid may function to slow down and prevent unwanted side reactions that may occur to result in the formation of one or more polymers. In this regard, the carboxylic acids when used may be present in the second solutions at a concentration ranging from about 0.0001% to 50% by weight.

The second solutions of the present disclosure may be made in any suitable manner, such as those described in U.S. Pat. No. 8,025,811, which are briefly described below. In general, preparation of a second solution consistent with the present disclosure may begin with the preparation of a dilute HF acid solution. By way of example, a dilute HF solution may be obtained by diluting concentrated HF acid with water to a desired concentration (e.g. 0.1 to 10 weight %). Once the dilute HF acid is prepared, optional components such as a carboxylic acid, surfactant/emulsifier, etc. nay be added.

After the addition of the optional components or if such components are not used, one or more silicon containing precursors may be added to the dilute HF acid solution at a temperature of about 20 to about 90° Celsius. In one embodiment, MTES is used as the silicon containing precursor, and is added to the dilute HF acid solution at a temperature ranging from 20° C. to 99° C. until a desired concentration of MTES (e.g., 0.5 to 10 weight %) was achieved.

The resulting mixture of dilute HF and silicon containing precursor may then be conditioned. In some embodiments, the mixture is conditioned, e.g., by heating it to a temperature ranging from about 60 to about 99° Celsius, and maintaining the mixture at that temperature for at least one hour. In instances where MTES is used as the silicon containing precursor, this heating is performed to drive reaction I below, which enhances the formation of silicic acid via breakdown of MTES.

$$CH_3Si(OCH_2CH_3)_3 + H_2O + HF \rightarrow SiOH_4 + H_2SiOx + CH_3CH_2OH + H_2O \quad (1)$$

The reaction kinetics favor MTES break down kinetics at a higher temperature, thus enhancing the formation of silicic acid and other silicon containing compounds, which may become fluorinated (e.g., to form $SiF_x$, $H_2SiF_x$, etc.) as the reaction proceeds. In any case, this heating is believed to produce the reaction products which give the second solution its selective metal etching characteristics. While reaction (1) above is specific to MTES, similar reactions occur by heating of other silicon containing precursors in dilute HF acid.

Prior to use, the mixture of dilute HF acid and silicon containing precursor may be allowed to cool to a desired operating temperature. Before, during, or after such cooling, a corrosion inhibitor and other optional components may be added. At this point a second solution consistent with the present disclosure is formed and may be applied to etch titanium in accordance with the present disclosure.

Figure 3:
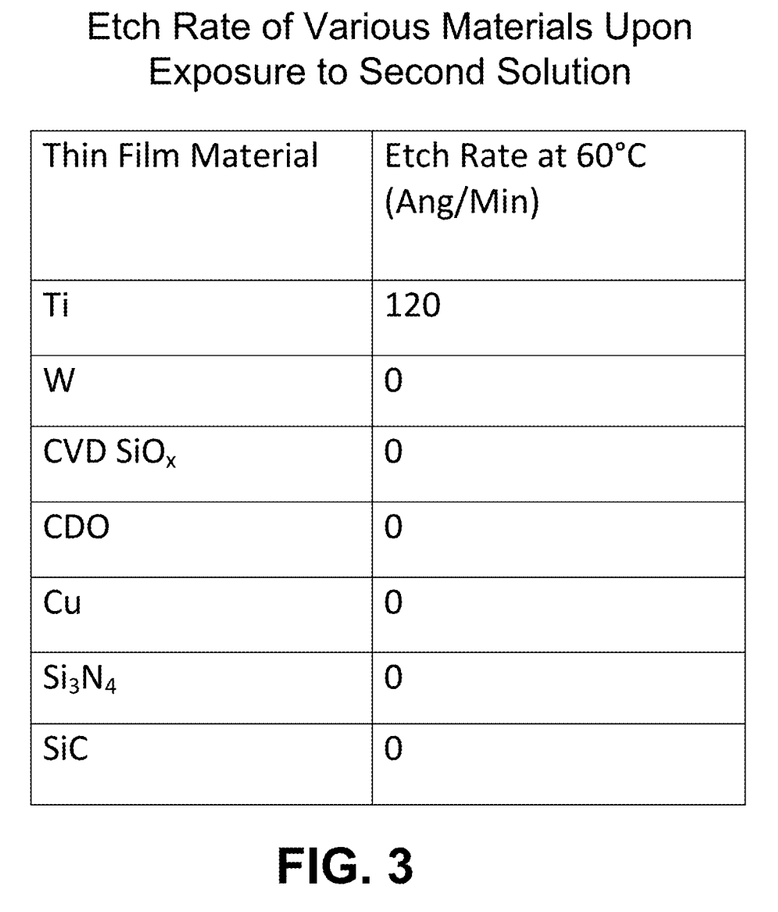
FIG. 3 is a table showing the etch rate of various metals upon exposure to a second solution consistent with the present disclosure.

Using the above described method or another method, in some embodiments a second solution is formed by adding MTES to a solution of HF acid, conditioning the mixture to promote formation of silicic acid and other products, and adding benzotriazole as a corrosion inhibitor to the mixture prior to using it to etch titanium As noted previously the second solutions of the present disclosure may selectively etch titanium while suppressing the etching of various other materials. This concept is illustrated in FIG. 3, which is a table depicting observed etch rates (in angstroms per minute) for various materials upon exposure to a second solution including benzotriazole as a corrosion inhibitor and the reaction products of dilute HF acid, MTES, and deionized water. As shown, the second solution was observed to etch titanium at a rate of about 120 angstroms per minute. In contrast, the observed etch rate of tungsten, chemical vapor deposited silicon, carbon doped oxide, $Si_3N_4$ and silicon carbide was 0 angstroms per minute, when such materials were exposed to the same second solution. This demonstrates the capability of the second solutions described herein to selectively etch titanium in a microelectronics device, while not etching or substantially not etching materials which may be in the presence of that titanium, namely oxides, metals such tungsten, dielectric materials insulating materials, etc.

Although not depicted, the second solutions described herein can also show appreciable etching rates for titanium silicide, which may be useful in instances where such silicide is formed (intentionally or otherwise) during the production of a microelectronics device. For example, titanium silicide may be formed by when a polishing process is applied to a workpiece that includes a titanium layer over a carbide.

For example, silicon carbide may be used as a capping material to cap one or more gates of a non-planar transistor and one or more titanium layers may be applied over the cap, e.g., prior to the formation of metal gate contacts. Polishing may be used to remove excess gate contact material, but may indirectly result in the formation of titanium silicide due to the combination of some amount of titanium from the titanium layer with the silicon in the underlying silicon carbide layer. In these and other instances, the second solutions of the present disclosure may be applied to remove titanium silicide as well as titanium in a manner that is relatively gentle with respect to other materials that in the presence of the titanium and silicide to be removed.

Returning to FIG. 1, a second solution consistent with the present disclosure may be applied as a wet etching solution to the workpiece, so as to etch all or a portion of the titanium layer thereon. Once etching of titanium has proceeded to a desired degree (e.g., to remove all or a portion of the titanium on the workpiece), the workpiece may be optionally processed (e.g., washed, heated, etc.) to remove the second solution, and the method may proceed to optional block 103. Pursuant to block 103, a third solution may be applied as a wet etching solution to remove residual titanium nitride that may be present on the workpiece, if any. In this regard, it is noted that application of the first solution described above may remove the bulk of titanium nitride from a targeted area of a workpiece, but some relatively small amount of titanium nitride may remain. In such instances, the third solution may be applied to selectively remove such residual titanium nitride in a manner that is relatively gentle to surrounding materials.

In general, the third solution is an etching chemistry that is formulated in the same or similar same manner as the first solutions of the present disclosure. That is like the first solution, this third solutions of the present disclosure include a mixture of a strong acid and peroxide. The selection of strong acid and peroxides for the third solution is the same as the first solution described above, and so is not reiterated in detail for the sake of brevity. In some embodiments, removal of residual TiN is accomplished by exposing the workpiece to a third solutions that includes a mixture of sulphuric acid and hydrogen peroxide, wherein the weight ratio of sulphuric acid to hydrogen peroxide ranges from about 1:15 to about 15:1, and is preferably in the range of about 12:1 to about 6:1, such as about 6:1 to about 8:1.

Without limitation, the third solution preferably has the same chemistry as the first solution described above. Therefore in some embodiments, the first and second solutions each include a mixture of sulphuric acid and hydrogen peroxide, wherein the ratio of sulphuric acid to hydrogen peroxide is about 12:1 to 6:1, such as about 6:1 to about 8:1.

In any case, the third solution may be applied to the workpiece as a wet etching chemistry to remove residual TiN, if any, from the workpiece. Controlling the temperature of the third solution as it is used to remove TiN from a workpiece may be desired, as it may enable control over the TiN etch rate. In some embodiments the temperature of the third solution ranges from about 60 to about 140° Celsius, such as from about 80 to about 120° Celsius or even about 90 to 110° Celsius, when it is contacted with residual TiN on a workpiece. Without limitation, the temperature of the first solution is preferably about 100° Celsius when it is contact with residual TiN on a workpiece.

Using the method described above, the first, second and third solutions of the present disclosure may be leveraged to selectively remove titanium nitride, titanium, and optionally titanium silicide in the presence of other materials such as oxide, insulating materials, metals other than titanium, and combinations thereof. Because the chemistries of the first, second and third solutions do not etch or do not substantially etch such other materials, they and the foregoing methods may be of particular use when it is desired to etch titanium and titanium nitride in the presence of such materials.

For the sake of illustration the present disclosure will now describe an exemplary embodiment wherein the first, second, and third solutions described above are used in the production of a microelectronics devices. In particular, the following discussion will focus on the use of the foregoing chemistries to selectively etch titanium nitride, titanium, and optionally titanium silicide during the production of a non-planar multigate microelectronic device, such as a double gate transistor, a FIN field effect transistor (FINFET), a tri-gate transistor, combinations thereof, and the like. It should be understood that the following description is exemplary only and that the chemistries described above may be used in any suitable application wherein selective etching of titanium nitride and titanium is desired.

In this regard, reference is made to FIGS. 4A-4G, which depict cross sectional views of a non-planar multi-gate transistor as it is being formed during part of a semiconductor manufacturing process. More particularly, FIGS. 4A-4G stepwise illustrate an exemplary process for forming a gate contact of a non-planar multigate FINFET transistor using the first, second, and optionally third solutions described above.

Figure 4A:
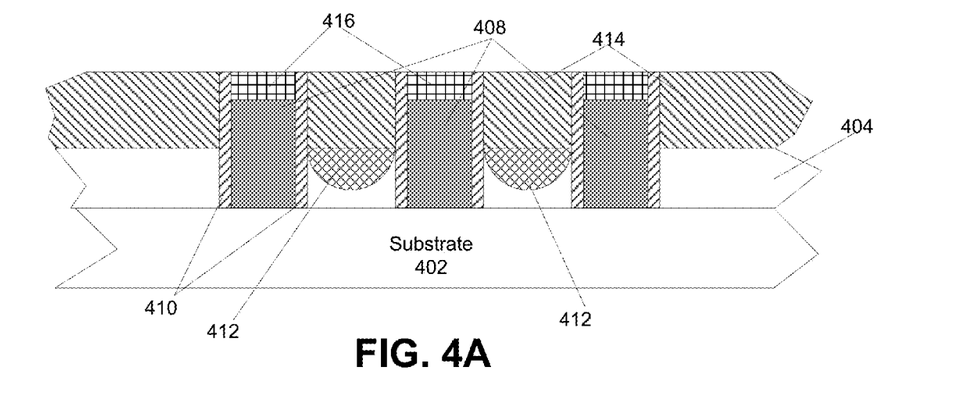
FIGS. 4A-4G stepwise illustrate one example of a process flow for forming a gate contact for a multigate transistor consistent with the present disclosure.

FIG. 4A depicts a cross sectional view of a nonplanar multigate FINFET transistor at one part of a semiconductor manufacturing process. As shown, the transistor at this stage includes substrate 402. Substrate 102 may be formed of any material that may be suitably used as a microelectronics substrate. Non-limiting examples of such materials include monocrystalline silicon, silicon on insulator (SOI), a germanium, gallium arsenide substrate, indium antimonide, lead telluride, indium arsenide, indium phosphide, gallium arsenide, gallium antimonide, combinations thereof, and the like, which may be combined with silicon.

As further shown in FIG. 4A, the transistor includes at least one non-planar transistor fin 404, which from the illustrated view is shown as a layer on substrate 402. Although not shown in this view, fin 404 may have a top surface and a pair of laterally opposite sidewalls. Non-planar transistor gates 408 may be formed over non-planar transistor fin 404. The illustrated view, which extends down the length of gates 408, depicts such gates as extending through fin 404. However, it should be understood that this illustration merely depicts the extension of gates 408 around the sides of fin 404. Gates 408 may include a conductive gate fill material, such as tungsten or another conductive material.

Gate fill barrier layers 410 may be disposed along the sides of gate 408, and gate 408 may be capped with gate capping material 416. In some embodiments, gate fill barrier layers 410 are each one or more layers of a titanium containing material, such as titanium, titanium nitride, and the like. For example, gate fill barrier layers 410 may each be a bilayer of titanium and titanium nitride. Gate capping material 416 may be any appropriate material, including but not limited to silicon nitride ($Si_3N_4$) and silicon carbide (SiC).

Fin 404, gate 408, gate barrier layers 410 and capping material 416 may be produced via any suitable semiconductor processing technique, as will be generally understood by those of skill in the art. In some embodiments, such components are formed via the techniques described and/or referenced in international patent application no. PCT US2011/054294.

In addition to the foregoing components, the non-planar transistor further includes source/drain regions 412, which are formed in fin 404 and disposed on one or both sides of gates 108. In some embodiments, source/drain regions 412 may be formed by doping fin 404, e.g., with p or n type dopants, as will be understood by those skilled in the art. Alternatively, source/drain regions 412 may be formed by removing portions of fin 404 and replacing those portions with appropriate materials to form the source and drain regions. Still further, source/drain regions 412 may be formed by epitaxially growing doped or unstrained layers on fin 404.

As further shown in FIG. 4A, the non-planar transistor may further include dielectric material 414, which may be initially deposited over the top on fin 404, gate spacer layers 410, and the upper surface of gate capping material 416, and subsequently planarized (e.g. via chemical mechanical planarization) such that its upper surface is substantially in plane with the upper surface of capping material 416, as shown in FIG. 4A. Dielectric material 414 may be any suitable dielectric material, such as but not limited to silicon nitride, silicon carbide, silicon dioxide, silicon oxynitride, combinations thereof, and the like.

Figure 4B:
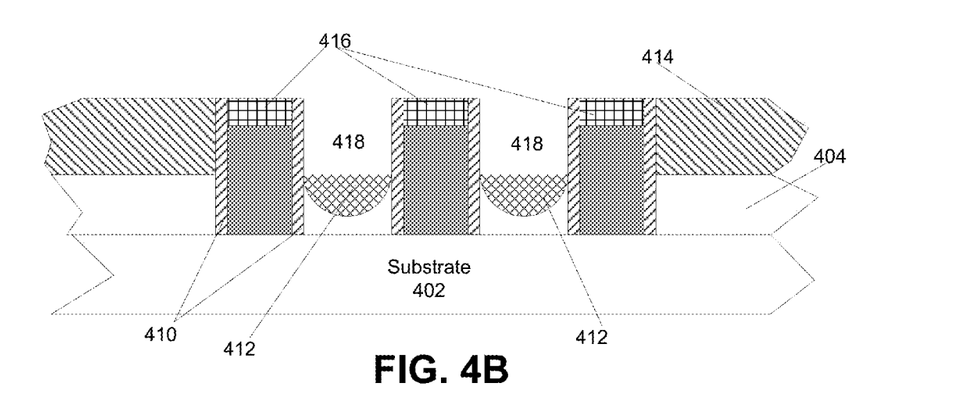

As shown in FIG. 4B, the production of a gate contact may begin with the formation of trenches or holes above or in proximity to source/drain regions 418. This may be accomplished using any technique known in the art, including selective mask and etching techniques which are capable of removing desired portions of dielectric material 414. For example, trenches 418 may be formed by using a suitable mask to mask certain regions of the transistor, exposing the transistor to an etching agent to remove dielectric material 414 about source/drain regions 412, and then removing the mask. Alternatively or additionally, all or a portion of dielectric material 414 may be removed using chemical mechanical planarization or some other process known in the art.

Figure 4C:
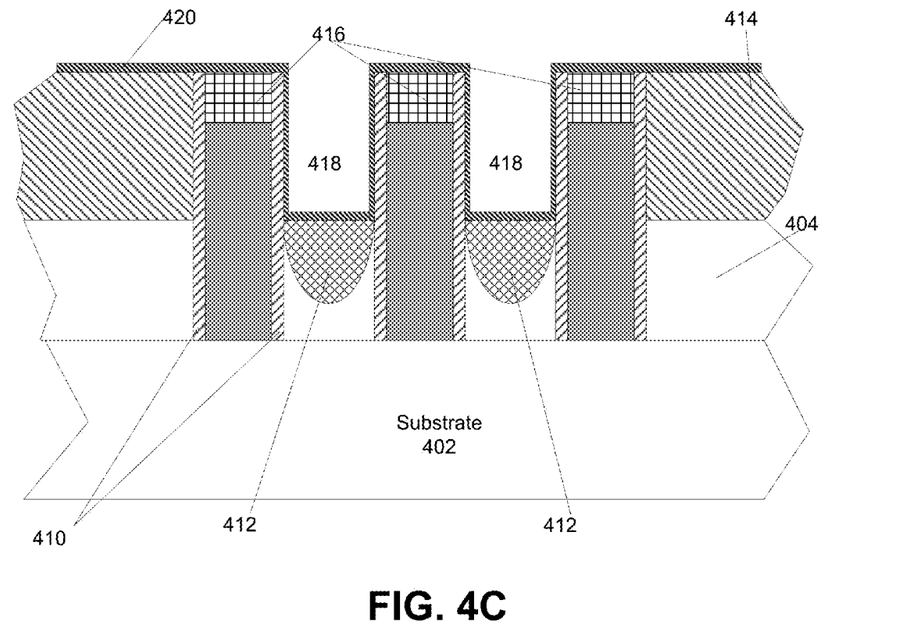

Turning now to FIG. 4C, the production of a gate contact may proceed by the deposition of first gate contact barrier layer 420. As shown, first gate contact barrier layer 420 is a conformal layer deposited over the surface of dielectric material 414, capping material 416, the sidewall of gate spacers 410, and the surface of source/drain regions 412. Although first gate contact barrier layer 420 may be made of various materials, for the sake of illustration in this embodiment first gate contact barrier layer 420 is formed of titanium, which may be deposited via physical vapor deposition or another suitable deposition technique known in the art.

Figure 4D:
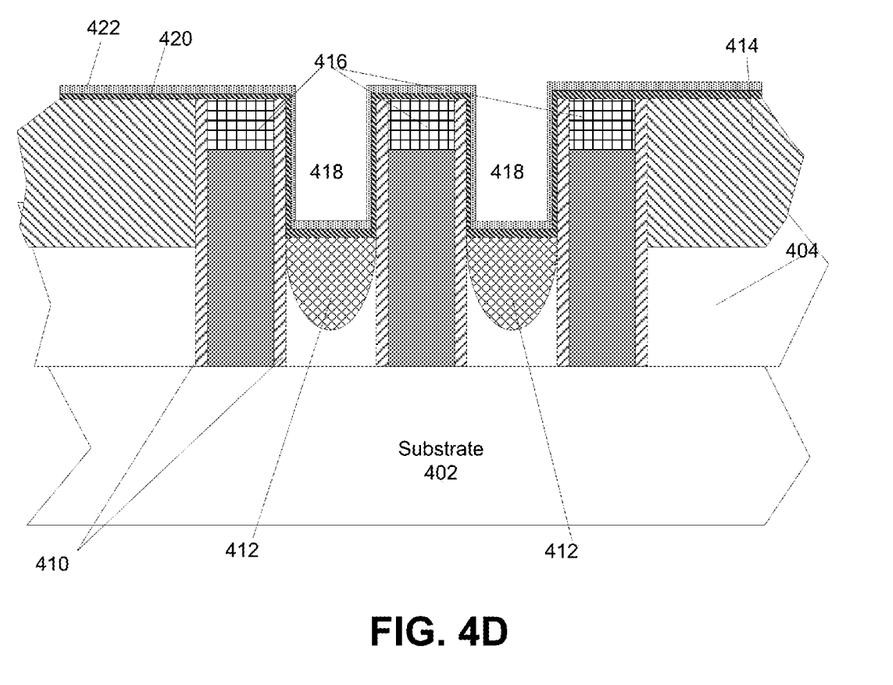

Because titanium is highly susceptible to oxidation, deposition of titanium first gate barrier layer 422 may be followed by the deposition of a second gate contact barrier layer. This concept is shown in FIG. 4D, which illustrates second gate barrier layer 422 as a conformal layer deposited on first gate barrier layer 420. Although second gate contact barrier layer 422 may be formed from various materials, for the sake of this illustration second gate barrier layer 422 is a layer of titanium nitride. Thus for example, second gate contact barrier layer 422 may be formed via a chemical vapor deposition process, e.g., using tetrakis(dimethylamino)titanium (TDMAT) with plasma densification. Alternatively, titanium nitride may be deposited via atomic layer deposition to form second gate contact barrier layer 422.

Figure 4E:
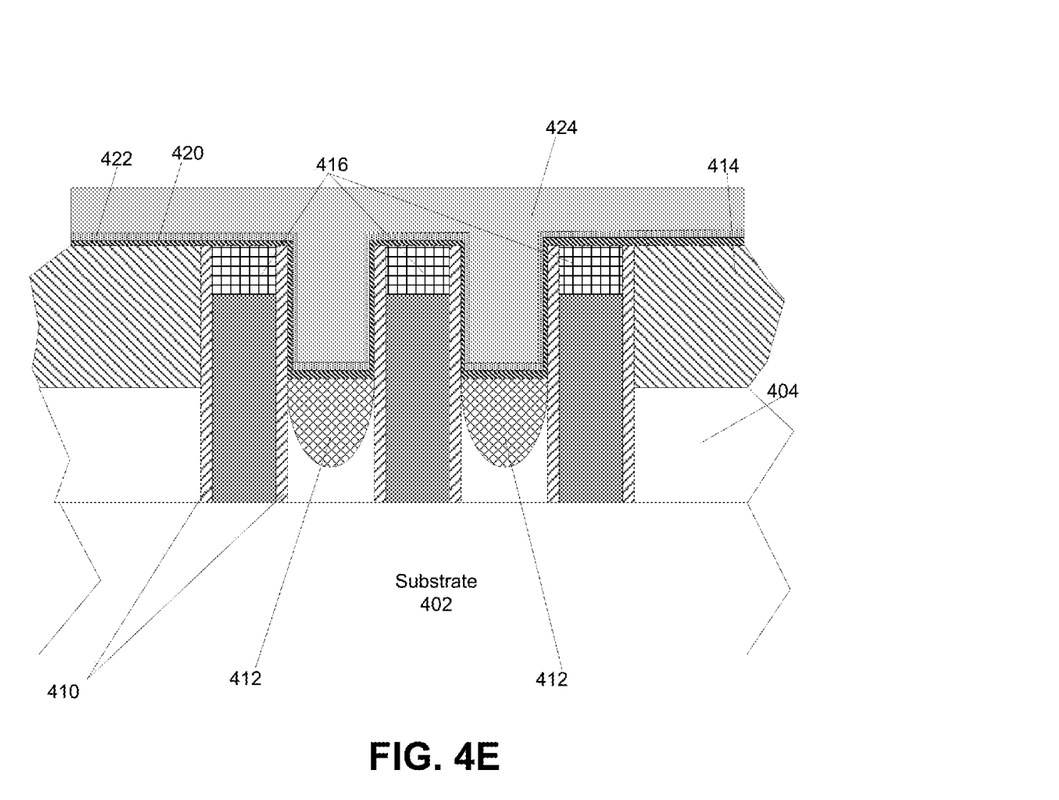

The production of a gate contact may then proceed with the deposition of a gate contact fill material 424, as shown in FIG. 4E. Gate contact fill material 424 may be formed from any conductive material that is suitable for use as a gate contact, including but not limited to polysilicon, tungsten, ruthenium, palladium, platinum, cobalt, nickel, hafnium, zirconium, tantalum, aluminum, metal carbides, metal nitrides, and metal oxides. Without limitation and for the sake of this example, gate contact fill material 424 is preferably formed from tungsten. In this regard, tungsten may be deposited as gate contact fill material 424 using any suitable process known in the art. For example, tungsten may be deposited as gate contact fill material 424 by initially forming a nucleation layer on second gate contact barrier layer 422, followed by bulk deposition of tungsten that may be grown using tungsten hexafluoride or another suitable material.

Figure 4F:
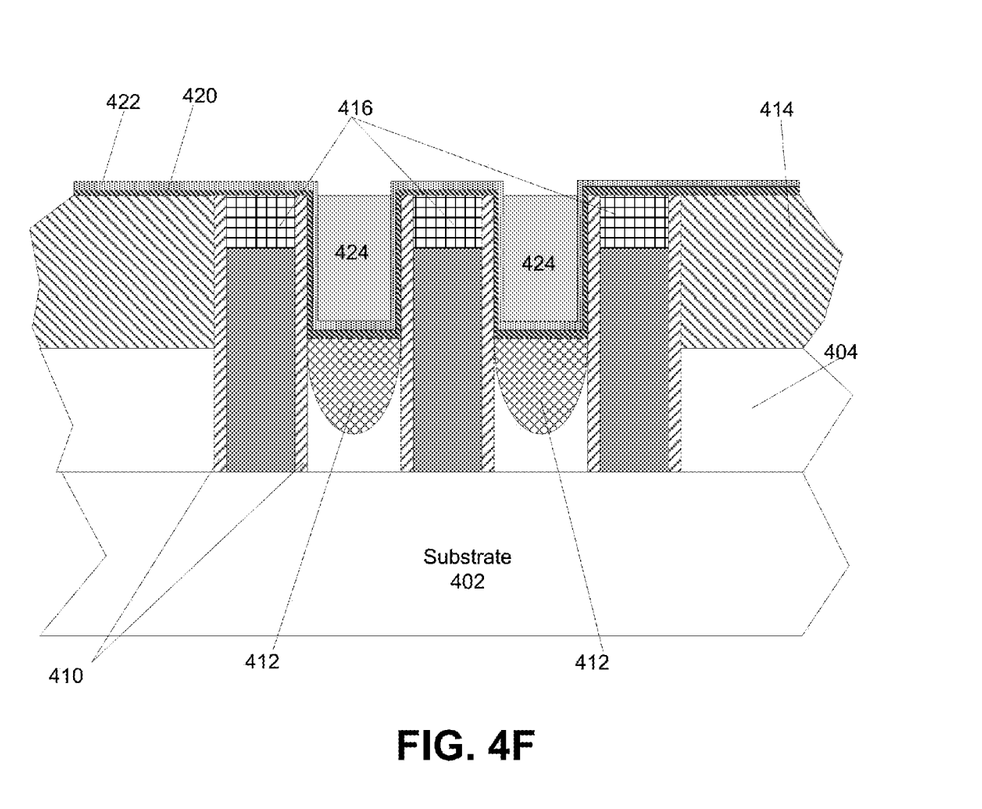

Production of a gate contact may then proceed by the removal of excess gate contact fill material 424, as shown in FIG. 4F. Removal of excess gate contact fill material 424 may be accomplished using any process known in the art, such as chemical mechanical planarization, etching, or the like. As shown, such processes may remove excess gate contact fill material until an upper surface of gate contact fill material 424 is substantially in plane with the upper surface of capping material 416. However, such processes may not remove first and second gate contact barrier layers 420, 422, respectively, which are formed from titanium and titanium nitride, respectively.

Indeed chemical mechanical planarization may be unable to remove the titanium and titanium nitride used to form first and second gate contact barrier layers 420, 422, even if substantial over polish times are used. And while aggressive HF acid based chemistries may remove titanium and titanium nitride, they may also attack and damage the materials used to form gate contact fill material 424, as well as dielectric material 414 and gate capping material 416. This may be problematic in some instances, particularly where titanium in gate contact barrier layer 420 may cause an electrical short if all or a portion of it is not removed.

With the foregoing in mind, the etching chemistries and processes of the present disclosure may be employed to selectively remove the titanium and titanium nitride of first and second gate contact barrier layers 420, 422, while leaving gate contact fill material 424 (e.g., tungsten), dielectric material 414 and capping material 416 unaffected or substantially unaffected. More specifically, a first solution consistent with the present disclosure (e.g., including a mixture of sulphuric acid and peroxide in ratio ranging from about 12:1 to about 6:1, such as about 6:1 to about 8:1) may be applied as a wet chemical etchant to the surface of second gate contact barrier layer 422 and the exposed surface of gate contact fill material 424. As noted above, the first solution can etch titanium nitride at a desired rate, but does not or substantially does not etch materials that may be used to form gate contact fill material 424, e.g., tungsten. As a result, a first solution consistent with the present disclosure may be applied to remove at least a portion of the titanium nitride forming second barrier layer 422, while not etching or not substantially etching the tungsten used as gate contact fill material 424.

Subsequently, a second solution consistent with the present disclosure may be applied as a wet chemical etching agent to the then exposed surface of the titanium forming first gate barrier layer 420, as well as the exposed surface of gate contact fill material 424. Like the first solutions of the present disclosure, the second solutions are configured to etch titanium at a first rate, while etching tungsten and other materials that may be used to form gate contact fill materials 424, capping material 416, and dielectric material 414 at a second rate, wherein the second rate is zero or 10 to 100 times less than the first rate. In this way, the second solutions of the present disclosure may be applied to remove at least a portion of the titanium forming first gate contact barrier layer 420, while not etching or not substantially etching the tungsten of gate contact fill material 424.

As noted previously, the second solution may also be formulated to selectively remove titanium silicide. As will be appreciated in the art, titanium silicide may be formed when chemical mechanical planarization or another technique is used to remove excess gate contact filling material 424. During such processes, titanium from first and/or second gate contact barrier layers 420, 422 may combine with silicon atoms from capping material 416, which as noted above may be SiC, $Si_3N_4$. In such instances, titanium silicide may be formed within first gate contact barrier layer 420 or at an interface thereof. To the extent titanium silicide is present, a second composition consistent with the present disclosure may be used to selectively remove it at the same time it is used to remove titanium from first gate contact barrier layer 420.

As noted above, some portion of titanium nitride may remain after exposure to the first solution, e.g., due to kinetic effects, insufficient exposure to the first solution, or otherwise. With this in mind, a third solution consistent with the present disclosure (which may preferably be the same as the first solution) may then be applied to the surface of the surface of the transistor to remove residual titanium nitride that may be present, if any.

Figure 4G:
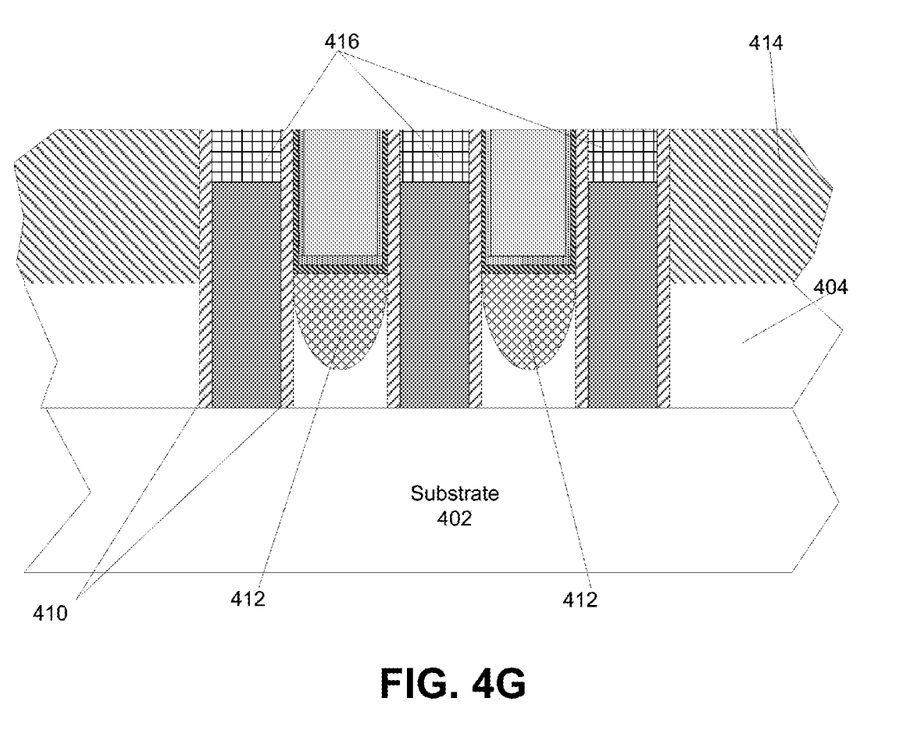

The effect of the application of the first, second, and third solutions consistent with the present disclosure is shown in FIG. 4G. As shown, such solutions in this embodiment have been applied to remove the titanium and titanium nitride forming first and second gate contact barrier layers 420, 422 in regions above dielectric material 414 and capping material 416. Notably, the height of gate contact filling material 424 has remained substantially unchanged after application of such solutions. That is as shown in FIG. 4F, gate contact filling material 424 was removed via chemical mechanical planarization or another technique until its upper surface was substantially in plane with the upper surface of capping material 424. As illustrated in FIG. 4G, the upper surface of gate contact filling material 424 remains substantially in plane with the upper surface of gate contact 416, highlighting the ability of the solutions described herein to selectively etch titanium and titanium nitride in the presence of the materials used to form gate contact filling material 424, i.e., tungsten.

That is, gate contact filling material 424 may have a first height before the transistor is exposed to the first, second and third solutions consistent with the present disclosure. After such exposure and as shown in FIG. 4G, the height of the gate contact filling material 424 is substantially the same as the first height. More specifically, exposure to the first, second and third solutions may reduce the first height of gate contacting filling material 424 (i.e., prior to such exposure) by less than about 5%, and more particularly less than about 1%.

Therefore in one embodiment of the present disclosure there is provided a method for selectively titanium and titanium nitride from a workpiece. The method includes contacting said workpiece with a first solution comprising sulphuric acid and a peroxide to remove at least a portion of said titanium nitride; contacting said workpiece with a second solution to remove at least a portion of titanium nitride, the second solution comprising a corrosion inhibitor and products of a mixture of dilute hydrofluoric acid (HF), a silicon containing precursor, and water; and contacting said workpiece with a third solution comprising sulphuric acid and a peroxide to remove at least a portion of residual titanium nitride on said workpiece, if any, remaining after contacting said workpiece with said first and second solutions. As described above, the foregoing method may be used to selectively remove titanium and titanium nitride from a workpiece such as a microelectronics device, while not etching or no substantially etching metals other than titanium, oxides, and/or dielectric materials that may be exposed to the first, second and third solutions.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

The invention claimed is:

1. A method for selectively removing titanium and titanium nitride from a workpiece, comprising:
   contacting said workpiece with a first solution comprising sulphuric acid and a peroxide to remove at least a portion of said titanium nitride;
   after removing at least a portion of said titanium nitride with said first solution, contacting said workpiece with a second solution to remove at least a portion of said titanium, the second solution comprising a corrosion inhibitor and products of a mixture of hydrofluoric acid (HF), a silicon containing precursor, and water; and
   contacting said workpiece with a third solution comprising sulphuric acid and a peroxide to remove at least a portion of residual titanium nitride on said workpiece, if any, remaining after contacting said workpiece with said first and second solutions;
   wherein said workpiece comprises:
   a non-planar transistor comprising at least a first gate having sides and a top surface;
   a gate barrier layer disposed on said sides;
   a gate capping material disposed on said top surface;
   a first gate contact barrier layer on said gate barrier layer and an upper surface of said gate capping material; and
   a second gate contact barrier layer on said first gate contact barrier layer,
   wherein said first gate contact barrier layer comprises said titanium, and said second gate contact barrier layer comprises said titanium nitride.

2. The method of claim 1, wherein:
   said workpiece comprises a dielectric material;
   said dielectric material is exposed to at least one of said first, second, and third solutions when said workpiece is contacted with at least one of said first, second and third solutions, respectively; and
   said first, second, and third solutions do not substantially etch said dielectric material.

3. The method of claim 2, wherein said dielectric material is selected from the group consisting of silicon dioxide, a silicate, carbon doped oxide (CDO), hafnium oxide, hafnium silicon oxide, lanthanum oxide, lanthanum aluminum oxide, zirconium oxide, zirconium silicon oxide, tantalum oxide, yttrium oxide, aluminum oxide, lead scandium tantalum oxide, lead zinc niobate, and combinations thereof.

4. The method of claim 1, wherein:
   said workpiece further comprises a metal other than titanium;
   said metal other than titanium is exposed to at least one of said first, second, and third solutions when said workpiece is contacted with at least one of said first, second and third solutions, respectively; and
   said first, second, and third solutions do not substantially etch said metal other than titanium.

5. The method of claim 4, wherein said metal other than titanium comprises tungsten.

6. The method of claim 1, wherein the peroxide in said first and third solutions is hydrogen peroxide.

7. The method of claim 1, wherein in each of said first and third solutions:
   said sulphuric acid is present in an amount ranging from about 70 weight to about 95 weight %; and
   said peroxide is present in an amount ranging from about 5 weight % to about 10 weight %.

8. The method of claim 7, wherein each of said first and third solutions include about 93 weight percent sulphuric acid and about 7 weight percent peroxide.

9. The method of claim 1, wherein said silicon containing precursor is at least one silane selected from the group consisting of amino functional silanes, epoxy functional silanes, vinyl functional silanes, ketoxime functional silanes, alkoxy functional silanes, acetoxy functional silanes, and combinations thereof.

10. The method of claim 9, wherein said silicon containing precursor is at least one alkoxy functional silane.

11. The method of claim 10, wherein said at least one alkoxy function silane is selected from the group consisting of methyltrimethoxysilane, methyltriethoxysilane (MTES), tetramethoxysilane (TMOS), tetraethoxysilane (TEOS), tetrapropoxysilane, and combinations thereof.

12. The method of claim 11, wherein said alkoxy functional siloxane is methyltriethoxysilane (MTES).

13. The method of claim 1, wherein said corrosion inhibitor is selected from the group consisting of 2-mercaptobenzothiazole, 2-mercaptobenzimidazole, 5-chlorobenzotriazole, 5-methylbenzotriazole, benzotriazole, carboxybenzotriazole, tolyltriazole, 1-phenyl-1h-tetrazole, and hexadecyltrimethylammonium bromide.

14. The method of claim 13, wherein said corrosion inhibitor is benzotriazole.

15. The method of claim 1, wherein said second solution has a pH ranging from about 1 to about 3, and said products comprise silicon fluoride, silicic acid and water.

16. The method of claim 1, wherein said second solution comprises a corrosion inhibitor and products of a mixture of dilute hydrofluoric acid and methyletriethoxysilane (MTES).

17. The method of claim 1, wherein said workpiece comprises at least a part of a semiconductor device, a precursor of a semiconductor device, or a combination thereof.

18. The method of claim 1, wherein said workpiece comprises a hard mask, said hard mask comprising a first portion comprising said titanium and titanium nitride.

19. The method of claim 1, wherein:
   said workpiece further comprises:
   at least a second gate offset from said first gate by a trench such that said first and second gates are in proximity to a source or drain of said non-planar transistor; and
   a gate contact filling material within said trench; and
   the method further comprises contacting said workpiece with said first, second and third solutions to remove said titanium and titanium nitride from at least a portion of said first and second gate contact barrier layers.

20. The method of claim 19, wherein:
   said gate contact filling material is exposed to at least one of said first, second and third solutions when said workpiece is exposed to at least one of said first, second and third solutions, respectively; and
   said gate contact filling material is not substantially etched by said first, second, and third solutions.

21. The method of claim 20, wherein said gate contact filling material comprises tungsten.

22. The method of claim 19, wherein said workpiece is contacted with said first, second and third solutions to remove said titanium, said titanium nitride, and said residual titanium nitride, respectively, from an upper surface of said gate capping material.

23. The method of claim 21, wherein:
   said gate contact filling material has a first height prior to exposing said workpiece to said first, second and third solutions; and said first height is substantially unchanged after exposing said workpiece to said first, second and third solutions.

24. The method of claim 23, wherein said gate contact filling material comprises tungsten.

* * * * *